United States Patent
Murase

Patent Number: 5,283,464
Date of Patent: Feb. 1, 1994

[54] ELECTRICALLY INSULATED HEAT PIPE TYPE COOLING APPARATUS FOR SEMICONDUCTOR

[75] Inventor: Takashi Murase, Yokohama, Japan

[73] Assignee: The Furukawa Electric Co., Ltd., Tokyo, Japan

[21] Appl. No.: 64,348

[22] Filed: May 20, 1993

Related U.S. Application Data

[63] Continuation of Ser. No. 798,998, Dec. 2, 1991, abandoned, which is a continuation of Ser. No. 533,866, Jun. 6, 1990, abandoned.

[30] Foreign Application Priority Data

Jun. 8, 1989 [JP] Japan .................. 1-145769

[51] Int. Cl.$^5$ .................. H01L 23/02; H01L 25/04
[52] U.S. Cl. .................. 257/714; 257/715; 257/717; 165/80.4; 165/104.33; 165/185; 361/689; 361/699; 174/15.2
[58] Field of Search .................. 357/82, 81; 165/104.33, 165/80.4, 185; 361/385, 382, 389; 257/712, 713, 714, 715, 716, 717, 722; 174/15.2

[56] References Cited

U.S. PATENT DOCUMENTS

| | | | |
|---|---|---|---|
| 3,792,318 | 2/1974 | Fries et al. | 357/82 |
| 4,023,616 | 5/1977 | Scherbaum | 357/82 |
| 4,574,877 | 3/1986 | Klein | 165/104.33 |
| 4,675,783 | 6/1987 | Murase et al. | 357/82 |
| 4,757,370 | 7/1988 | Agonafer et al. | 357/82 |
| 4,899,211 | 2/1990 | Dumoulin | 357/82 |
| 4,982,274 | 1/1991 | Murase et al. | 357/82 |
| 5,043,797 | 8/1991 | Lopes | 357/82 |

FOREIGN PATENT DOCUMENTS

| | | |
|---|---|---|
| 3327125 | 2/1984 | Fed. Rep. of Germany . |
| 59-130450 | 7/1984 | Japan . |
| 61-110883 | 10/1986 | Japan . |
| 62-293654 | 12/1987 | Japan . |

OTHER PUBLICATIONS

"Cooling Device for Multilayer Ceramic Modules" by B. T. Clark et al, IBM Technical Disclosure Bulletin, vol. 20, No. 5, Oct. 1977; pp. 1769–1771.

"Warmtepijpkoeling voor halfgeleidercomponenten" by De Heer M. C. van der Walle, 825 PT/Elektrotechniek Elektronica, 42 (1987) Dec., No. 12, Rijswijk (Z-H), The Netherlands.

Primary Examiner—William Mintel
Assistant Examiner—David Ostrowski

[57] ABSTRACT

An electrically insulated heat pipe type cooling apparatus for a semiconductor comprising a heat absorption section for cooling a semiconductor, a heat dissipation section and an intermediate electrical insulation section. This apparatus is capable of highly improving cooling efficiency for a semiconductor and exhibiting satisfactory electrical insulation.

21 Claims, 7 Drawing Sheets

ELECTRICALLY INSULATED HEAT PIPE TYPE COOLING APPARATUS FOR SEMICONDUCTOR

This application is a continuation of application Ser. No. 07/798,998 filed Dec. 2, 1991, now abandoned, which is a continuation of Ser. No. 07/533,866 filed on Jun. 6, 1990, now abandoned.

FIELD OF THE INVENTION

This invention relates to an electrically insulated heat pipe type cooling apparatus for a semiconductor, and more particularly to electrically insulated heat pipe type cooling apparatus that is adapted to cool a power semiconductor, such as a thyristor or the like, by water, with high performance and electrical safety.

BACKGROUND OF THE INVENTION

A heat pipe for a semiconductor that is used for cooling a power transistor generally is composed of pipes, fins mounted at one end of the pipes so as to serve as a heat dissipation section, semiconductor mounting metal blocks mounted at the other end of each pipe so as to act as a heat absorption section, and insulation cylinders positioned at the intermediate portion of the pipes, to connect the pipes to each other, as disclosed in Japanese Patent Application (OPI) No. 293654/1987. In the so-constructed conventional heat pipe, heat generated from the semiconductor is transferred through the metal block to the heat pipe and is transferred to the fins of the heat dissipation section by the heat pipe effect. This results in the heat being outwardly dissipated or discharged by natural convection and/or forced convection by a fan or the like.

In recent years, a semiconductor of a high density and a mass storage capacity has been proposed and manufactured. The development of such a semiconductor creates a need for a cooling apparatus capable of exhibiting better cooling efficiency to cool the semiconductor.

Figure 7:
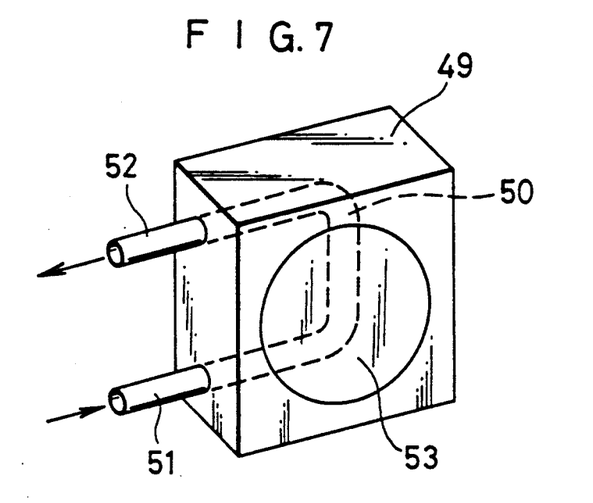
FIGS. 7 and 8 each are a perspective view showing a conventional cooling apparatus for a semiconductor.

Conventionally, a water-cooled-type cooling apparatus has been used for directly cooling a semiconductor. The water-cooled cooling apparatus is generally constructed in such a manner as shown in FIG. 7. More particularly, in the cooling apparatus, a metal block 49, of satisfactory thermal conductivity for mounting a semiconductor is provided therein with a passage 50 for cooling water, so that cooing water is guided from an inlet nozzle 51 through the passage 50 to an outlet nozzle 52, to cool a transistor 53 that is generating heat. Unfortunately, the water-cooled-type cooling apparatus is low in cooling efficiency, resulting in an inability to meet the recent requirements for cooling a semiconductor.

Figure 8:
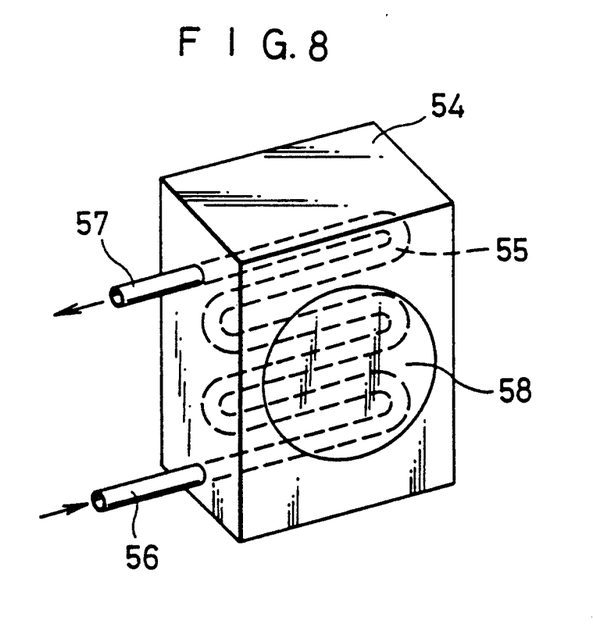

An improvement in cooling efficiency of the cooling apparatus requires increasing the length of the passage 50. For this purpose, an approach is proposed in which, as shown in FIG. 8, a passage 55 in a metal block 54 is provided to form a plurality of meandering flows. In FIG. 8, reference numerals 56 and 57 each designate a nozzle and reference numeral 58 designates a semiconductor.

However, the formation of the passage 55 in the metal block 54 requires much labor and time due to its complicated construction, leading to an increase in manufacturing cost. Also, there was a limitation of cooling efficiency even by this improvement. Thus, the water-cooled-type cooling apparatus fails to not only contribute to manufacturing of a semiconductor of a high density and of a mass storage capacity but also to provide a semiconductor with satisfactory electrical insulation.

BRIEF SUMMARY OF THE INVENTION

The present invention has been made in view of the foregoing disadvantages of the prior art.

Accordingly, it is an object of the present invention to provide an electrically insulated heat pipe type cooling apparatus for a semiconductor that is capable of highly improving cooling efficiency and exhibiting satisfactory electrical insulation.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and many of the attendant advantages of the present invention will be readily appreciated as they become better understood by reference to the following detailed description when considered in connection with the accompanying drawings which are given by way of illustration only, and thus are not limitive of the present invention, and wherein:

FIG. 5($a$) is a front elevation view showing a water cooling apparatus cooled jacket in still another embodiment of an electrically insulated heat pipe type cooling apparatus for a semiconductor according to the present invention;

FIG. 5($b$) is a fragmentary enlarged view of the heat pipe type of the water-cooled jacket shown in FIG. 5($a$);

DETAILED DESCRIPTION OF THE INVENTION

The present invention provides an electrically insulated heat pipe type cooling apparatus for a semiconductor, characterized in that at least one heat pipe type is provided at its intermediate portion with an electrical insulation cylinder, through which the heat pipe type is divided into a heat absorption section and a heat dissipation section, wherein the heat absorption section is provided with a metal block for mounting a semiconductor thereon, and the heat dissipation section is provided with a water-cooled structure.

In the present invention, the metal pipes (hereinafter referred to as "first metal pipes") of the heat dissipation section of the heat pipe insulated electrically by insulation cylinder comprise a water-cooled jacket made of corrosion-resistant material, such as copper, stainless steel, or synthetic resin, to thereby cause heat generated from a semiconductor and transferred to the heat pipe type to be discharged with high efficiency.

The electrical insulation cylinder made by ceramics, for example, alumina is interposedly arranged between the first metal pipes for the heat dissipation and metal pipes (hereinafter referred to as "second metal pipe") for the heat absorption section, to connect the first and second pipes to each other Also, in the present invention, liquid fluorocarbon, which likewise exhibits electrical insulation properties, may be used as an operating fluid. Such construction of the present invention permits the heat pipe to be contacted directly by water, while preventing the potential of the semiconductor affecting the first metal pipes, so that the heat pipe type cooling apparatus of the present invention substantially improves cooling efficiency.

The first and second metal pipes each may be made of copper, stainless steel, or the like. The pipes each are subject on the inner surface thereof to groove processing or cross groove processing, resulting in improving heat absorption and heat dissipation due to boiling and condensation actions. Further, the first and second metal pipes may be formed into diameters or shapes different from each other, to thereby adjust or control the heat absorption and/or dissipation. The water-cooled structure may be made of corrosion-resistant metal, such as copper, copper alloy, aluminum, stainless steel, and synthetic resin. Moreover, the water-cooled jacket is provided therein with at least one baffle plate to keep the cooling effect uniform. The number of heat pipes is preferably 2 to 10, more preferably 2 to 8, but the present invention is not restricted to these numbers. According to a required cooling capacity, a plurality of heat pipes may be arranged lengthwise and breadthwise in an water cooled jacket in this invention.

DETAILED DESCRIPTION OF THE PREFERRED EMBODIMENTS

The present invention will be described hereinafter with reference to the accompanying drawings.

Figure 1:
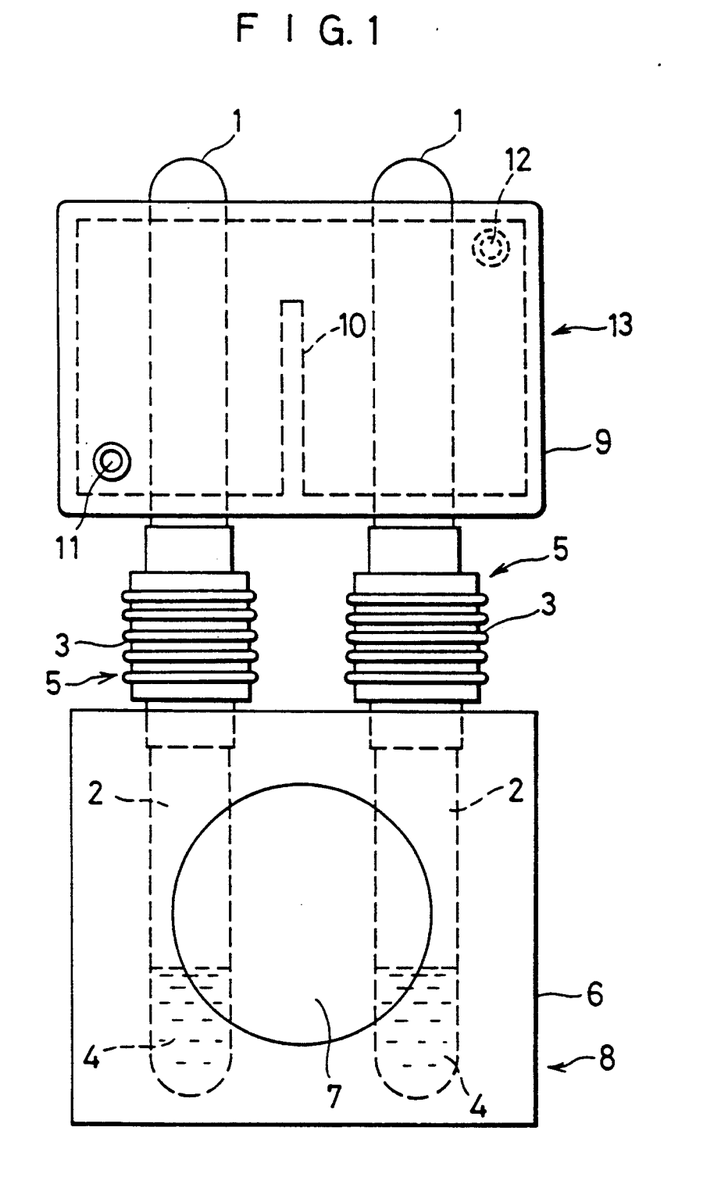
FIG. 1 is a front elevation view showing an embodiment of an electrically insulated heat pipe type cooling apparatus for a semiconductor according to the present invention.
Figure 2:
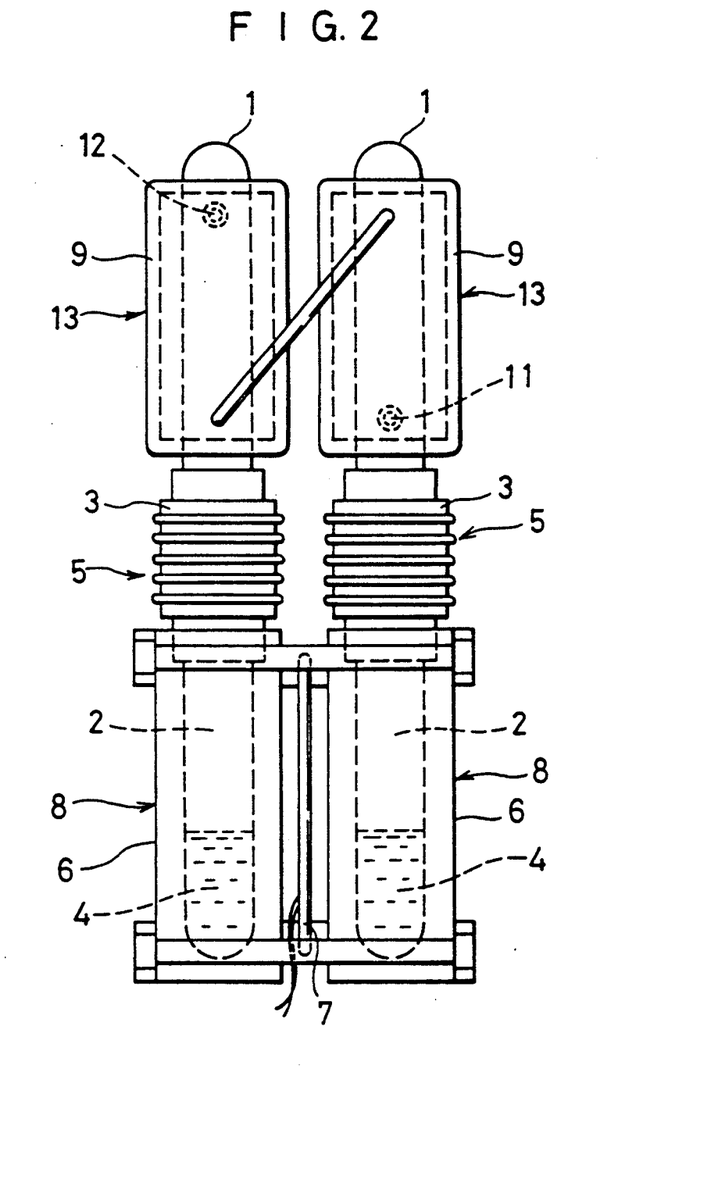
FIG. 2 is a side elevation view of the heat pipe type cooling apparatus shown in FIG. 1.

FIGS. 1 and 2 illustrate an embodiment of an electrically insulated heat pipe type cooling apparatus for a semiconductor according to the present invention in a front elevation view and side elevation view, respectively. The heat pipe type cooling apparatus of the illustrated embodiment includes first metal pipes 1 and 1, each open at one end, and second metal pipes 2 and 2, each likewise open at one end. The first pipes 1 and 1 and second pipes 2 and 2 are connected to each other through insulation cylinders 3 and 3, in such a manner that their open ends are opposite from each other, respectively, and each may be formed of copper with an outer diameter of, for example, about 22.23 mm. The insulation cylinders 3 and 3 may be formed of aluminum. Operating fluids 4 and 4 of liquid fluorocarbon having electrical insulation properties in predetermined amounts are sealed in the so connected pipes. Thus the heat pipes 5 and 5 are formed. The second metal pipes 2 and 2 of the heat pipes 5 and 5 are mounted in a metal block 6, which may be formed of copper. On the outer surface of the block 6 is mounted semiconductor 7, such as a thyristor or the like, resulting in a heat absorption section 8 being formed.

The first metal pipes 1 and 1 of the heat pipes 5 and 5 each are inserted in a water-cooled jacket 9, in a manner to project from the upper end thereof. The water-cooled jacket 9 may be made of stainless steel that is, for example, 1.0 mm in thickness. In the water-cooled jacket 9 is arranged, a baffle plate 10 is arranged to be positioned between the metal pipes 1 and 1. Also, the water-cooled jacket 9 is provided at the left corner of its front surface with an inlet nozzle 11, through which water is fed into the jacket 9, and at the right corner of its back surface with an outlet nozzle 12, through which water is discharged from the jacket 9 (FIG. 1). Thus, a cooling section 13 is formed.

In the cooling apparatus described above, usually a semiconductor 7 is put between heat absorption sections 8 and 8 and then pressed suitably by clamp means. Heat generated from the semiconductor 7 is transmitted or transferred through the metal block 6 to the second metal pipes 2 and 2, to cause the operating fluids 4 and 4 to evaporate. Heat transfer to the, first or upper metal pipes 1 and 1, results such that heat is carried out through the evaporated liquids. Water introduced through the inlet nozzle 11 into the jacket 9 and then discharged therefrom through the outlet nozzle 12 serves to directly cool the upper pipes 1 and 1 in the water-cooled jacket 9, so that the cooling of the pipes may be accomplished with high efficiency. The baffle plate 10 functions to control the flow of water in the jacket 9.

The heat pipes 5 and 5, as described above, are provided at their intermediate portions with insulation cylinders 3 and 3, so that the first metal pipes 1 and 1 may be electrically insulated from the second metal pipes 2 and 2. This eliminates the necessity of using specifically prepared water, such as ion-exchanged water or the like, as cooling water. Thus, ordinary tap water or the like may be used for this purpose. Also, the above-described construction permits the area of each of the heat pipes to be enlarged as desired, to thereby increase its cooling area.

In the present invention, the cooling section 13 may be constructed in various manners other than that described above. This is described below.

Figure 3:
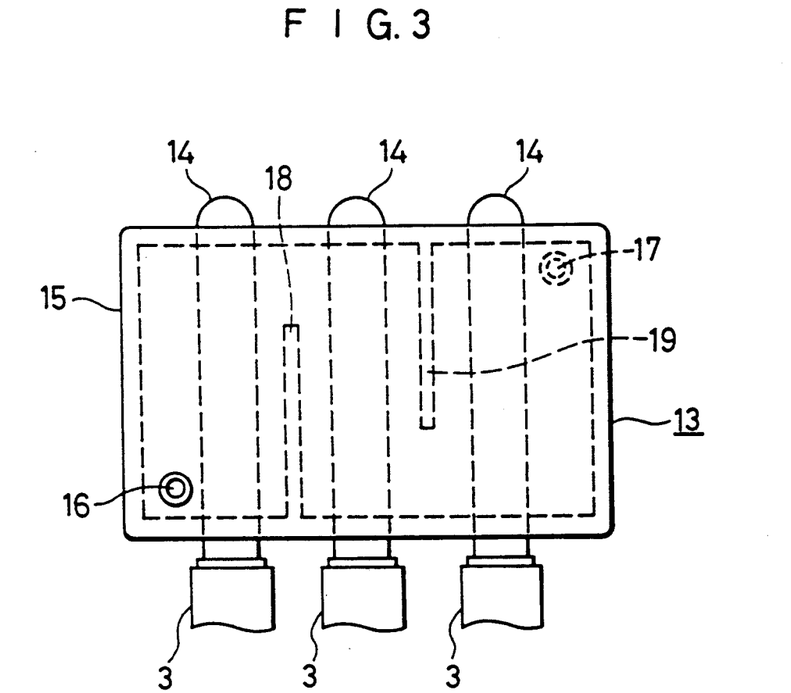
FIG. 3 is a front elevation view showing a water-cooled jacket in another embodiment of an electrically insulated heat pipe type cooling apparatus for a semiconductor according to the present invention.

FIG. 3 shows a cooling section 13 in another embodiment of the present invention. More specifically, the cooling section 13 includes first metal pipes 14, 14, and 14 and insulation cylinders 3, 3, and 3. The first pipes 14, 14, and 14 each are inserted into a water-cooled jacket 15, in a manner to be exposed or project from the upper end thereof. The cooling section also includes an inlet nozzle 16 provided at the left lower portion of the front surface of the water-cooled jacket 15, so as to feed cooling water to the jacket 15, and an outlet nozzle 17 provided at the right upper portion of the front surface of the jacket 15, through which the water is discharged from the jacket. In the water-cooled jacket 15 a baffle plate 18 is arranged between the metal pipes 14 and 14, so as to upwardly extend from the bottom of the jacket 15. Likewise, a baffle plate 19 is provided, in a manner to be positioned between the metal pipes 14 and 14 and to downwardly extend form the upper surface of the jacket 15.

Thus, in the embodiment shown in FIG. 3, the number of heat pipes is increased by one and correspondingly the number of baffle plates is increased by one, as compared with those in the embodiment shown in FIGS. 1 and 2.

Figure 4:
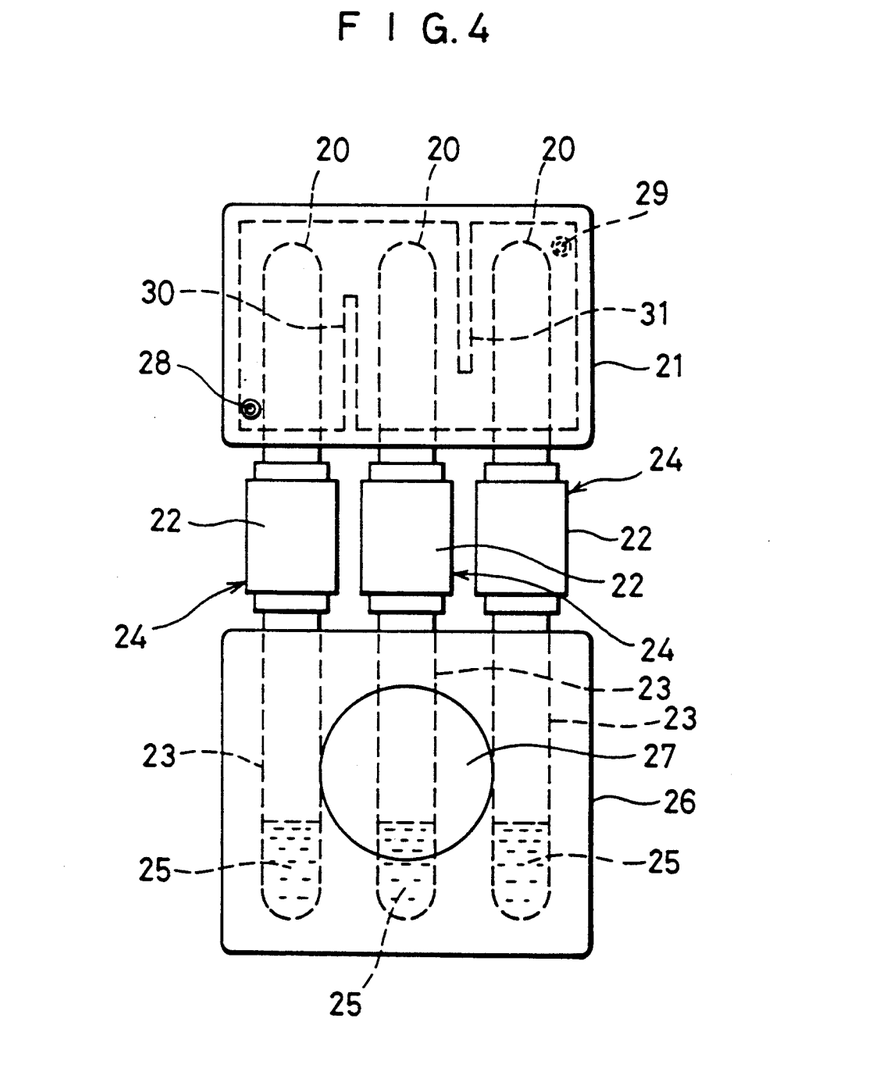
FIG. 4 is a front elevation view showing a further embodiment of an electrically insulated heat pipe type cooling apparatus for a semiconductor according to the present invention.

FIG. 4 shows a further embodiment of a heat pipe type cooling apparatus according to the present invention. In this embodiment, first metal pipes 20, 20, and 20 each are arranged in a water-cooled jacket 21 so as not to project from the upper end thereof, and bare insulators 22, 22, and 22 are used for an insulation section. The remaining part of the embodiment of FIG. 4 may be constructed in substantially the same manner as that of FIGS. 1 and 2. In FIG. 4, reference numerals 23, 23, and 23 each designate a second metal pipe, thus, three heat pipes 24, 24, and 24 are formed. In the heat pipes 24, 24 and 24 operating fluids 25, 25, and 25, respectively are contained. Reference numeral 26 indicates a metal block, and 27 indicates a semiconductor mounted (arranged) on the outer surface of the metal block 26. Reference numerals 30 and 31 each designate a baffle plate.

Figure 5A:
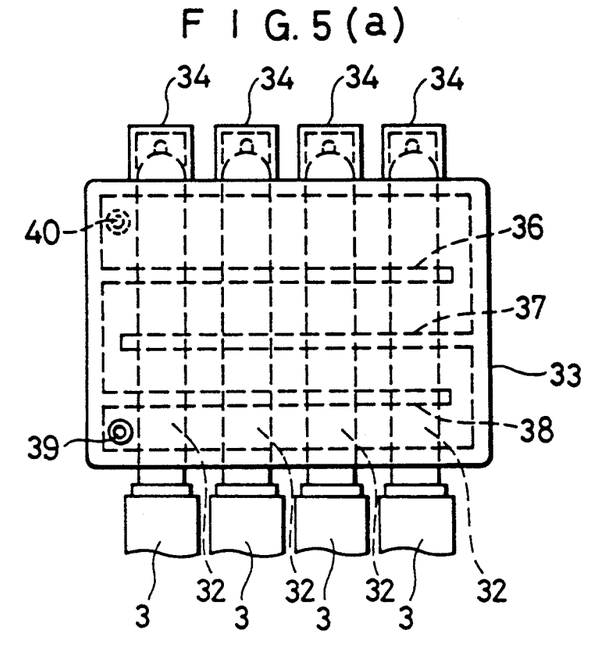
Figure 5B:
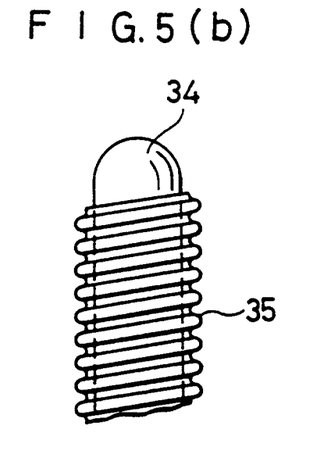

FIGS. 5(a) and 5(b) show a cooling section 13 in still another embodiment of an electrically insulated heat pipe type cooler for a semiconductor according to the present invention, in which four heat pipes are arranged in a water-cooled jacket 33 so as to project the upper end thereof from the upper surface of the jacket 33. The projecting ends of each pipe 32 are covered with protective caps 34, 34, 34, and 34, respectively. Also, the cooling section includes four insulation cylinders 3, 3, 3, and 3. The heat pipes 34 each are provided on their outer peripheries with, for example, low fins 35, 35, 35, and 35, for enlarging surface area to improve the convection effect with water, as shown in FIG. 5(b). The water-cooled jacket 33 is provided on its side with laterally extending baffle plates 36, 37, and 38, in a manner to be vertically spaced from each another. In this embodiment, cooling water flows in a turbulent flow, making cooling more effective. The water-cooled jacket 33 is provided at the lower portion of its front surface with an inlet nozzle 39, through which cooling water is fed to the jacket, and at its upper end with an outlet nozzle 40, through which water is discharged from the jacket. The remaining part of the embodiment may be constructed in substantially the same way as the embodiment of FIG. 1.

Figure 6:
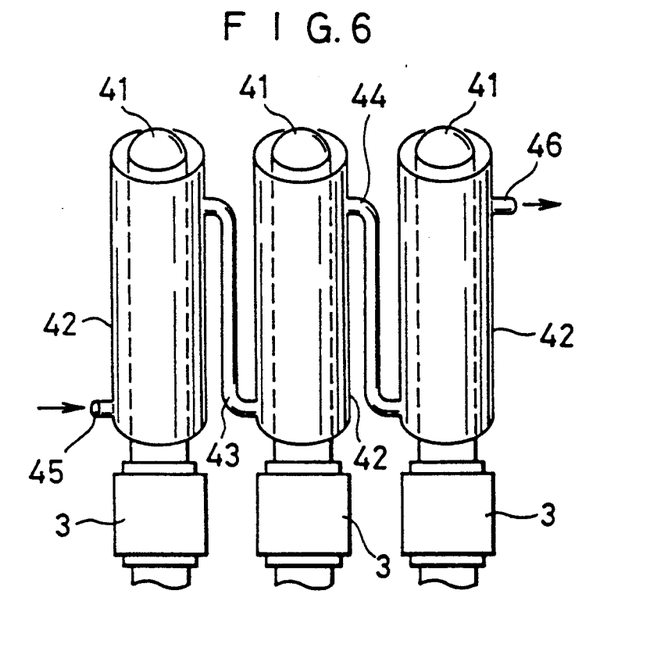
FIG. 6 is a front perspective view showing yet another embodiment of an electrically insulated heat pipe type cooling apparatus for a semiconductor according to the present invention.

FIG. 6 shows a cooling section in yet another embodiment of an electrically insulated heat pipe type cooling apparatus according to the present invention. A cooling section of FIG. 6 includes first metal pipes 41, 41, and 41, which are connected at one end to insulation cylinders 3, 3, and 3, respectively. The first metal pipes 41, 41, and 41 are arranged in water-cooled cylinders 42, 42, and 42 in a manner to project from the upper ends thereof. The right upper portion of the water-cooled cylinder 42 of the left hand side and the left lower potion of the cylinder 42 of the middle are connected to each other through a communication pipe 43, and the right upper portion of the middle cylinder 42 and the left lower portion of the cylinder 42 of the right hand side are connected to each other through a communication nozzle pipe 44. Also, the water-cooled cylinder 42 of the left hand side is provided at its left lower portion with an inlet nozzle 45, and the cylinder 42 of the right hand side is provided at its right lower portion with an outlet nozzle 46. The remaining part of the embodiment of FIG. 6 may be constructed in substantially the same manner as that shown in FIG. 1.

This embodiment is advantageous and favorable in the production and assembling process of the heat pipe type cooling apparatus, because individual cooling section composed of metal pipe 41 and water-cooled cylinder 42 can be manufactured separately and can be assembled together with each other at the point of usage.

In a further type of cooling section, a flat pipe for cooling water may be used instead of water jacket shown in FIG. 6, by winding the flat pipe spirally on the outer surface of first metal pipe.

According to the present invention, industrially remarkable effects can be attained by carrying out the cooling of semiconductor efficiently and electrically safely.

The features of the embodiments are summarized as follows:

1. Capability to make the system for cooling a semiconductor small size and light weight,
2. Superior cooling capacity and high reliability due to using heat pipe,
3. Electrical safety by using electrical insulator between heat absorption section and heat dissipation section,
4. Increased freeness of apparatus design by changing the size and shape of each component such as block, fin, and heat pipe, and
5. Maintenance free due to independent individual component.

While preferred embodiments of the invention have been described with a certain degree of particularity with reference to the drawings, obvious modifications and variations are possible in light of the above details. It is therefore to be understood that within the scope of the appended claims, the invention may be practiced in manners other than those described.

What we claim is:

1. An electrically insulated heat pipe type cooling apparatus for a semiconductor comprising:

a plurality of heat pipe, each heat pipe being divided into a heat adsorption section and a heat dissipation section with an intermediate portion therebetween, the intermediate portion of each heat pipe being provided with an electrically insulated cylinder, at least the heat adsorption section having an open interior without any obstructions therein, the interior of the adsorption section being generally linear with a single central axis, the single central axis of the open interior of the adsorption section being aligned with a central axis of the heat dissipation section and a central axis of the intermediate portion of the heat pipe;

a block for mounting a semiconductor thereon, the block being provided at the heat absorption section of at least one of the heat pipes;

a single block, water-cooled jacket structure provided at the heat dissipation section of the plurality of heat pipes such that the water-cooled jacket surrounds a plurality of dissipation sections, said water-cooled structure having a single water inlet and a single water outlet for flow of cooling water through the jacket structure to simultaneously cool the plurality of dissipation sections; and flow control means within the water-cooled jacket for controlling flow of cooling water through the jacket, the flow control means comprising at least one baffle plate provided in an interior of the water-cooled jacket, the at least one baffle plate controlling the flow of water from the single inlet to the single outlet of the water-cooled jacket.

2. The electrically insulated heat pipe type cooling apparatus as claimed in claim 1, further comprising:
a second set of a plurality of heat pipes, each heat pipe being divided into a heat adsorption section and a heat dissipation section with an intermediate portion therebetween, the intermediate portion of each heat pipe being provided with an electrically insulated cylinder;
a second block provided at the heat adsorption section of at least one of the second set of heat pipes, the semiconductor being mountable between the block and second block; and
a second water-cooled jacket structure provided at the heat dissipation section of each of the second set of heat pipes, wherein said second water-cooled structure has a water inlet and a water outlet for flow of cooling water through the jacket structure.

3. The electrically insulated heat pipe type cooling apparatus as claimed in claim 2, wherein the second water-cooled structure has a single water inlet and a single water outlet.

4. The electrically insulated heat pipe type cooling apparatus as claimed in claim 2, wherein the plurality of heat pipes are generally aligned in a first plane and wherein the second set of heat pipes are generally aligned in a second plane, the first and second planes generally being parallel.

5. The electronically insulated heat pipe type cooling apparatus as claimed in claim 1, wherein the plurality of heat pipes are generally aligned in a plane and are only on one side of the semiconductor.

6. The electrically insulated heat pipe type cooling apparatus as claimed in claim 1, wherein said water-cooled structure comprises a, metal water-cooled jacket.

7. The electrically insulated heat pipe type cooling apparatus as claimed in claim 6, wherein the water-cooled jacket generally has an open interior between the water inlet and the water outlet with the heat dissipation section of each of the heat pipes inserted into the open interior of the water-cooled jacket.

8. The electrically insulated heat pipe type cooling apparatus as claimed in claim 7, wherein the baffle plate is provided in the interior of the water-cooled jacket intermediate the inlet and the outlet, the water-cooled jacket having a lower side from which the baffle plate extends.

9. The electrically insulated heat pipe type cooling apparatus as claimed in claim 7, wherein two baffle plates are provided in the interior of the water-cooled jacket between the inlet and the outlet, the water-cooled jacket having an upper side and a lower side, a first one of the baffle plates extending from the lower side of the water-cooled jacket and a second one of the baffle plates extending from an upper side of the water-cooled jacket.

10. The electrically insulated heat pipe type cooling apparatus as claimed in claim 9, wherein a predetermined distance is provided between the upper and lower sides of the water-cooled jacket and wherein both the first and second baffle plates have a length which is greater than one-half of the predetermined distance such that the water flows along a nonlinear path in the water-cooled jacket.

11. The electrically insulated heat pipe type cooling apparatus as claimed in claim 10, wherein the water inlet is positioned near the lower side of the water-cooled jacket and the water outlet is positioned near the upper side of the water-cooled jacket such that the water flows in a zig-zag path through the water-cooled jacket.

12. The electrically insulated heat pipe type cooling apparatus as claimed in claim 9, wherein three heat pipes are provided, a first one of the heat pipes being positioned next to the first baffle plate, a second one of the heat pipes being positioned between the first and second baffle plates, and a third one of the heat pipes being positioned next to the second baffle plate, the three heat pipes being generally aligned in a plane with the baffle plates therebetween.

13. The electrically insulated heat pipe type cooling apparatus as claimed in claim 12, wherein each of the three heat pipes have a tip end at the heat dissipation section thereof, each tip end being located distally from the intermediate portion and being positioned outside of the water-cooled jacket.

14. The electrically insulated heat pipe type cooling apparatus as claimed in claim 12, wherein each of the three heat pipes have a tip end at the heat dissipation section thereof, each tip end being located distally from the intermediate portion and being positioned within the water-cooled jacket.

15. The electrically insulated heat pipe type cooling apparatus as claimed in claim 7, wherein three baffle plates are provided in the interior of the water-cooled jacket, the water-cooled jacket having a right and left side and a first and second one of the baffle plates extend from one of the right and left sides of the water-cooled jacket while a third one of the baffle plates extends from an opposite side of the water-cooled jacket, the third baffle plate being located between the first and second baffle plates.

16. The electrically insulated heat pipe type cooling apparatus as claimed in claim 15, wherein four heat pipes are provided, each of the heat pipes having a longitudinal axis and each of the baffle plates having a longitudinal axis, the longitudinal axes of the heat pipes being generally perpendicular to the longitudinal axes of the baffle plates.

17. The electrically insulated heat pipe type cooling apparatus as claimed in claim 15, wherein each of the plurality of heat pipes has a tip end at the heat dissipation section thereof, each tip end being located distally from the intermediate portion of the heat pipe and being projected above a top of the water cooled jacket, the cooling apparatus further comprising a protective cap covering the tip end of each of the plurality of heat pipes.

18. The electrically insulated heat pipe type cooling apparatus as claimed in claim 1, wherein one of two, three and four heat pipes are provided as the plurality of heat pipes and wherein each heat pipe has a tip end at the heat dissipation section thereof, each tip end being located distally from the intermediate portion of the heat pipe.

19. The electrically insulated heat pipe type cooling apparatus as claimed in claim 18, wherein the water-cooled structure has a top surface and the tip end of each of the heat pipes projects above the top surface of the water-cooled structure.

20. The electrically insulated heat pipe type cooling apparatus as claimed in claim 18, wherein the tip end of each of the heat pipes is located within the water-cooled structure.

21. The electrically insulated heat pipe type cooling apparatus as claimed in claim 1, wherein each of the plurality of heat pipes are provided with fins on at least a portion of an outer periphery thereof.

* * * * *